(12) United States Patent  
Gotoh et al.

(10) Patent No.: US 8,599,325 B2  
(45) Date of Patent: Dec. 3, 2013

(54) LIQUID CRYSTAL DISPLAY DEVICE

(71) Applicants: Japan Display Inc., Chiba (JP); Panasonic Liquid Crystal Co., Ltd., Hyogo-ken (JP)

(72) Inventors: Jun Gotoh, Mobara (JP); Hirotaka Imayama, Mobara (JP); Shinichi Komura, Mobara (JP); Masato Shimura, Mobara (JP)

(73) Assignees: Hitachi Displays, Ltd., Chiba (JP); Panasonic Liquid Crystal Display Co., Ltd., Hyogo (JP)

( * ) Notice: Subject to any disclaimer, the term of this patent is extended or adjusted under 35 U.S.C. 154(b) by 0 days.

(21) Appl. No.: 13/899,788

(22) Filed: May 22, 2013

(65) Prior Publication Data

US 2013/0248898 A1    Sep. 26, 2013

Related U.S. Application Data

(63) Continuation of application No. 13/283,674, filed on Oct. 28, 2011, now Pat. No. 8,451,418.

(30) Foreign Application Priority Data

Oct. 29, 2010    (JP) ................. 2010-243411

(51) Int. Cl.
*G02F 1/136*    (2006.01)

(52) U.S. Cl.
USPC .......................................... 349/43

(58) Field of Classification Search
USPC .......................................... 349/43
See application file for complete search history.

(56) References Cited

U.S. PATENT DOCUMENTS

2007/0298538 A1    12/2007    Tanabe et al.
2009/0180069 A1    7/2009    Nishimura

FOREIGN PATENT DOCUMENTS

JP    2007-328210    12/2007
JP    2009-168878    7/2009

*Primary Examiner* — Phu Vu
(74) *Attorney, Agent, or Firm* — Antonelli, Terry, Stout & Kraus, LLP.

(57) ABSTRACT

A liquid crystal display device includes a TFT substrate with gate lines and drain lines, and pixel electrodes each formed in a region surrounded by the gate lines and drain lines. Protrusions are formed below the gate lines, each of the protrusions having an upper surface and at least one inclined side surface. A gate insulating film is formed over the gate lines, a semiconductor layer formed on the gate insulating film, and drain electrodes formed and source electrodes formed over the semiconductor layer. Channel portions are defined by the space between the drain electrodes and the source electrodes, each of the channel portions being formed covering the upper surface and at least one of the at least one inclined side surface of one of the protrusions, the pixel and source electrode being in contact with each other on at least one inclined side surface of the protrusion.

8 Claims, 16 Drawing Sheets

A–A

B-B

C-C

D-D

E-E

F-F

H-H

A-A

LIQUID CRYSTAL DISPLAY DEVICE

CROSS REFERENCE TO RELATED APPLICATION

This application is a continuation of U.S. application Ser. No. 13/283,674, filed Oct. 28, 2011, the contents of which are incorporated herein by reference.

CLAIM OF PRIORITY

The present application claims priority from Japanese Patent Application JP 2010-243411 filed on Oct. 29, 2010, the content of which is hereby incorporated by reference into this application.

BACKGROUND OF THE INVENTION

1. Field of the Invention

The present invention relates to a display device, and particularly relates to a liquid crystal display device capable of maintaining brightness even when the screen is high definition and the size of a pixel is decreased.

2. Description of the Related Art

A liquid crystal display device includes a TFT substrate, a counter electrode opposing the TFT substrate, and liquid crystals put between the TFT substrate and the counter substrate. The TFT substrate has pixels including electrodes, thin film transistors (TFT), etc. formed thereon in a matrix form. The counter electrode has color filters, etc. formed at positions corresponding to the pixel electrodes of the TFT substrate. The liquid crystal display device forms images by controlling light transmittance of each pixel using liquid crystal molecules.

Since liquid crystal display devices are flat and light in weight, they are applied in various fields. Small sized liquid crystal display devices are used generally for mobile phones, DSCs (digital still cameras), etc. In the small-size liquid crystal display devices, the size of the pixel is decreased in order to maintain the definition of the screen. Each of the pixels includes, in addition to the pixel electrode, the TFT, a through hole formed for connecting the TFT and the pixel electrode, etc. It is difficult to decrease the size of the TFT and the through hole correspondingly with the decrease of pixel size. Therefore, when the size of the pixel is decreased, the area of the pixel electrode is reduced. The transmittance of a liquid crystal display panel is thus lowered and the brightness of the liquid crystal display device is decreased.

In addition, viewing angle characteristics issue a problem in the liquid crystal display device. The viewing angle characteristics are a phenomenon that brightness and chromaticity differ from when the screen is observed from the front to when viewed from an oblique direction. An IPS (In Plane Switching) system, a system which operates liquid crystal molecules by a horizontal electrode field, has good characteristics in respect of the viewing angle characteristics.

Since, in the IPS system, the pixel electrode and the counter electrode are formed on the TFT substrate side, the problem of the transmittance is further severe. Various kinds of IPS systems exist; for example, a system predominant at current forms a counter electrode as a solid plane, disposes a comb-shaped pixel electrode thereover with an insulating film being put between the two, and generates an electric field between the two electrodes to rotate liquid crystal molecules. This system allows the transmittance to be increased. JP-A-2007-328210 describes a liquid crystal display device using such a system. Incidentally, a system that forms a pixel electrode as a solid plane and disposes a comb-shaped counter electrode thereover with an insulating film being put between the two is similar to the system mentioned above.

On the other hand, JP-A-2009-168878 discloses a configuration such that forms a counter electrode in a layer identical with the gate electrode, and forms a comb-shaped pixel electrode thereover with a gate insulating film and a protective insulating film put between them. According to JP-A-2009-168878, this configuration enables the number of layers in the TFT substrate to be reduced.

SUMMARY OF THE INVENTION

Recently, a high definition screen such as VGA (video graphics array: 640×480 dots) has been demanded also for a small-sized liquid crystal display device. Since the dot comprises a set of three pixels, that is, a red pixel, a green pixel, and a blue pixel, the number of pixels are 1920×480. In order to implement VGA in a 3 inch screen, the minor diameter of the pixel is required to be as small as 32 µM.

To maintain a predetermined transmittance even when the size of the pixel is decreased, it is necessary to dispose TFT, through hole, etc. in a small area, and increase the ratio of the pixel electrode area as much as possible. However, size-reduction of the TFT and the through hole for connecting the source electrode and the pixel electrode of the TFT, in accordance with the reduction of the pixel area, is limited regarding the performance of the liquid crystal display device and the margin of the manufacturing process. In the configuration according to JP-A-2009-168878, the through hole is formed in only one layer, that is the inorganic passivation film, and the area of the through hole can be decreased to thereby improve the transmittance. However, this is still not sufficient.

An object of the present invention is to provide a liquid crystal display device capable of maintaining the brightness of the liquid crystal display device by increasing the ratio of an area of a pixel electrode in a pixel without lowering the performance of a TFT while ensuring the margin of the process even when the size of the pixel is decreased. While an IPS system liquid crystal display device is used as an example for describing the problem in the conventional technology, a TN (twisted nematic) system and a VA (vertical alignment) system also have a substantially similar problem.

The configuration according to the present invention for achieving the object is described below.

(1) A liquid crystal display device comprising:
a TFT substrate;
gate lines extending in a first direction and arranged in a second direction over the TFT substrate;
drain lines extending in the second direction and arranged in the first direction over the TFT substrate;
pixel electrodes each formed in a region surrounded by the gate lines and drain lines;
trapezoidal protrusions formed discretely in the first direction below the gate lines, each of the trapezoidal protrusions having an upper surface and inclined surfaces in the cross section taken along a plane orthogonal to the first direction;
a gate insulating film formed over the gate lines;
a semiconductor layer formed on the gate insulating film;
drain electrodes formed by the drain lines over the semiconductor layer;
source electrodes formed over the semiconductor layer; and
channel portions defined by the space between the drain electrodes and the source electrodes, each of the channel portions being formed covering the upper surface and the inclined surfaces of the trapezoidal protrusion;

wherein the pixel electrode and the source electrode are in contact with each other on the inclined surface of the trapezoidal protrusion.

(2) When an inorganic passivation film is interposed between the source electrode and the pixel electrode, a through hole is formed in the inorganic passivation film above the upper surface of the trapezoidal protrusion. The source electrode and the pixel electrode are electrically connected via the through hole.

(3) A continuous bank is formed below the gate line instead of the trapezoidal intrusion formed discretely below the gate line. The TFT is formed over the bank, and the source electrode and the pixel electrode are electrically connected over the inclined surface of the bank.

(4) When the continuous bank is formed below the gate line instead of the trapezoidal protrusion formed discretely below the gate line, the TFT is formed over the bank, and the inorganic passivation film is interposed between a source electrode and a pixel electrode, a through hole is formed in the inorganic passivation film above the upper surface of the bank. The source electrode and the pixel electrode are electrically connected via the through hole.

(5) The configurations described above can be applied to any of the IPS system, the TN system, and the VA system.

According to the configuration (1), the TFT is formed at the trapezoidal protrusion and a thorough hole is not used. Thus, most of the pixel region can be used for the pixel electrode and the transmittance of the liquid crystal display panel can be improved.

According to the configuration (2), even when the source electrode and the pixel electrode of the TFT are electrically connected via the through hole formed in the inorganic passivation film, the through hole is formed above the trapezoidal protrusion. Thus, most of the pixel region can be used for the pixel electrode and the transmittance of the liquid crystal display panel can also be improved.

According to the configuration (3), the TFT is formed on the continuous bank and a through hole is not used. Thus, most of the pixel region can be used for the pixel electrode and the transmittance of the liquid crystal display panel can be improved.

According to the configuration (4), even when the source electrode and the pixel electrode of the TFT are electrically connected via the through hole formed in the inorganic passivation film, the through hole is formed above the upper surface of the bank. Thus, most of the pixel region can be used for the pixel electrode and the transmittance of the liquid crystal display panel can be improved.

DESCRIPTION OF THE PREFERRED EMBODIMENTS

The present invention is to be described in detail in accordance with preferred embodiments.

Embodiment 1

Figure 1:
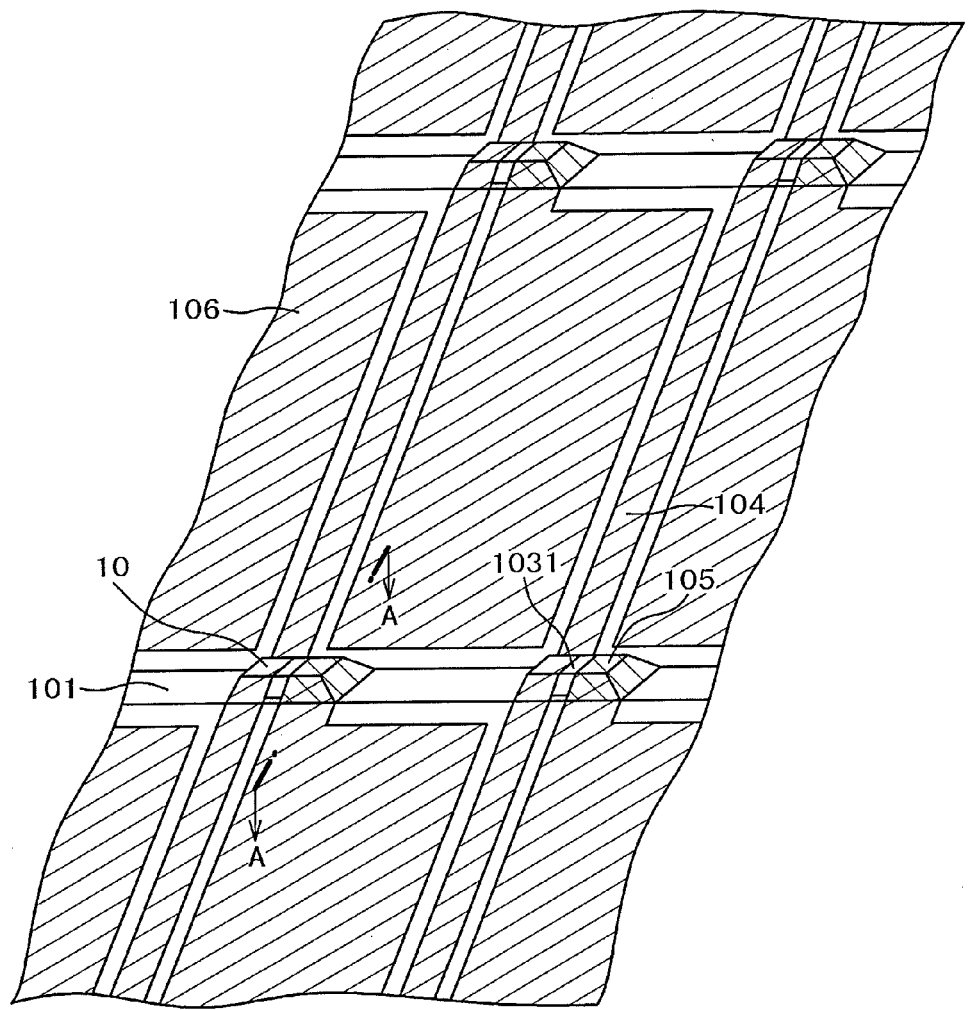
FIG. 1 is a perspective view of a TFT substrate for Embodiment 1.

FIG. 1 is a perspective view for a TFT substrate 100 in a liquid crystal display panel of this embodiment.

Figure 2:
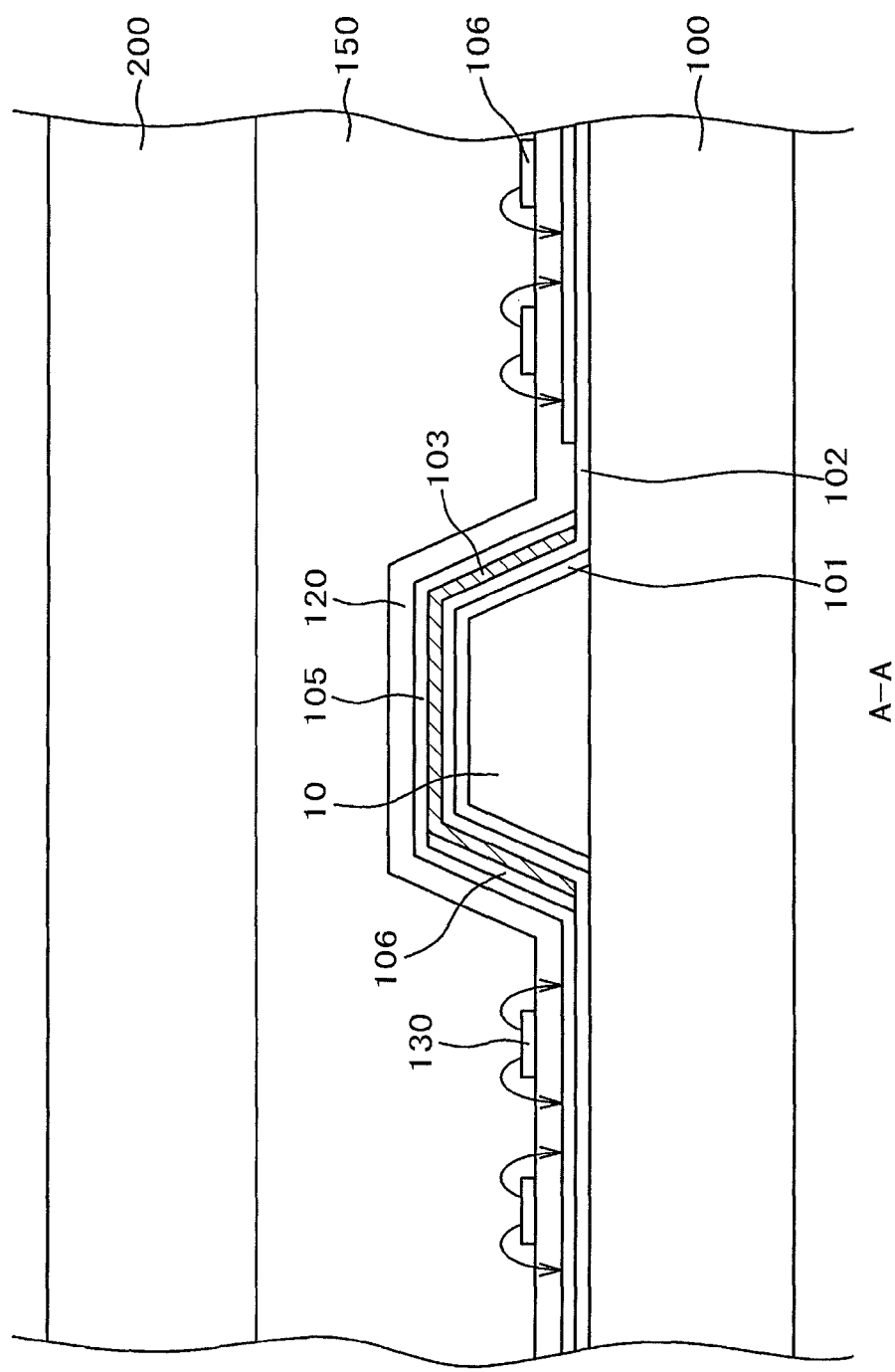
FIG. 2 is a cross sectional view of a liquid crystal display panel corresponding to a cross section taken along the line A-A in Embodiment 1.
Figure 3:
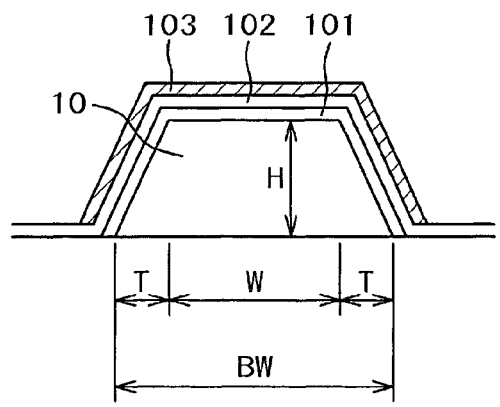
FIG. 3 is a cross sectional view of a channel portion of a TFT.

FIG. 1 is a perspective view showing a configuration of the TFT substrate 100 up to a pixel electrode 106. FIG. 2 is a cross sectional view of the liquid crystal display panel taken along the line A-A in FIG. 1. FIG. 3 is a cross sectional view along a channel portion 1031 of a TFT in FIG. 1.

In FIG. 1, a gate line 101 extends in a lateral direction, a drain line 104 extends in a longitudinal direction, and a pixel electrode 106 is present in a region surrounded by the gate line 101 and the drain line 104. The pixel electrode 106 is formed in a solid plane in the configuration of FIG. 1. A trapezoidal protrusion is formed below the gate line 101. The trapezoidal protrusion is hereinafter referred to as trapezoidal portion 10. The TFT is formed over the trapezoidal portion 10.

In FIG. 1, the drain line 104 is present on the left side of the trapezoidal portion 10 which serves as a drain electrode 104.

Further, a source electrode 105 is formed on the right side of the trapezoidal portion 10. A channel portion 1031 is defined by the space between the drain electrode 104 and the source electrode 105, and the channel portion 1031 is formed so as to extend on the upper surface and the inclined surfaces of the trapezoidal portion 10.

The pixel electrode 106 is connected directly with the source electrode 105 at the inclined surface of the trapezoidal portion 10 not by way of a through hole. Thus, substantially the whole region surrounded by the gate line 101 and the drain line 104 can be used for forming the pixel electrode 106. The transmittance of the liquid crystal display panel can be improved greatly compared with the conventional technology.

FIG. 2 shows a cross sectional view of the liquid crystal display panel taken along the line A-A in FIG. 1. In FIG. 2, the trapezoidal portion 10 is formed on the TFT substrate 100. The gate line 101 is formed over the surface of the trapezoidal portion 10. A gate insulating film 102 is formed covering the entire TFT substrate 100 including the gate line 101. A semiconductor layer 103 of a-Si is formed on part of the gate insulating film 102. The source electrode 105 is formed over the semiconductor layer 103.

The pixel electrode 106 and the source electrode 105 are in direct contact with each other on the inclined surface of the trapezoidal portion 10. Thus, a through hole for connecting the source electrode 105 of the TFT and the pixel electrode 106 does not exist in this embodiment. In addition, since the source electrode 105 and the pixel electrode 106 are connected on the inclined surface of the trapezoidal portion 10, reduction of the transmittance in the connection portion does not occur.

An interlayer insulating film 120 is formed covering the source electrode 105 and the pixel electrode 106. A comb-shaped counter electrode 130 is formed on the interlayer insulating film 120. The comb-shaped counter electrode 130 and the pixel electrode 106 (formed in a solid plane in a lower layer) generate lines of electric force between them and rotate liquid crystal molecules to control the light transmitting the liquid crystal layer 150 and form an image.

In FIG. 2, a liquid crystal layer 150 is put between the TFT substrate 100 and a counter substrate 200. In FIG. 2, an alignment film for performing initial alignment of liquid crystals is not illustrated. As shown in FIG. 2, since the TFT and the through hole do not exist in the pixel area in this embodiment, the transmittance of the pixel can be improved remarkably.

FIG. 3 is a cross sectional view of a channel portion 1031 of the TFT formed over the trapezoidal portion 10. It is necessary to form the TFT on the gate line 101 in this embodiment. However, when the width of the channel portion 1031 is small, sufficient ON current cannot be obtained and the switching speed is lowered. As to solve this problem, in the present invention, the channel portion 1031 is formed over the upper surface and the inclined surfaces of the trapezoidal portion 10 to secure a required channel width.

In FIG. 3, the gate line 101 is formed covering the trapezoidal portion 10, and the gate insulating film 102 is formed thereover. The semiconductor 103 is formed on the gate insulating film 102 covering the upper surface and the inclined surfaces of the trapezoidal portion 10. Accordingly, substantially the entire surface of the trapezoidal portion 10 is used as the channel portion 1031.

When the height H, the top width TW (the length of the upper side), and the bottom width BW (the length of the bottom side) of the cross section of the trapezoidal portion 10 in FIG. 3 are respectively set as H=2 μm, TW=4 μm, and BW=6 μm, the value of T showed in FIG. 3 is 1 μm. When the channel portion 1031 is formed over the entire trapezoidal surface, the width of the channel portion 1031 is; $4+2\sqrt{5}=8.47$ μm. When the trapezoidal portion 10 is not formed, even if the entire part of gate line 101 is used for the channel portion 1031, the width is 6 μm. Thus, the present invention allows the width of the channel portion 1031 to be increased by 40% or more and the ON current of the TFT can be increased correspondingly.

Figure 4:
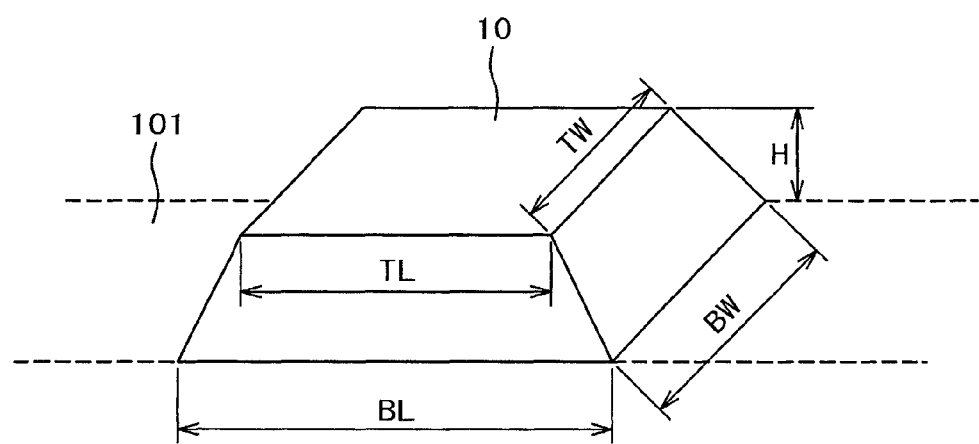
FIG. 4 is a perspective view of a trapezoidal portion.

FIGS. 4 to 9 show a process for forming a main part of the invention. First, as shown in FIG. 4, a trapezoidal portion 10 is formed on a TFT substrate 100. The trapezoidal portion 10 is formed at a position where a gate line 101 is to be formed. Although the gate line 101 is not yet formed at the time the trapezoidal portion 10 is formed, the area of the gate line 101 to be formed is shown by a dotted line in FIG. 4.

The trapezoidal portion 10 can be formed of, for example, a photosensitive acrylic resin or a phenol resin, etc. The shape of the trapezoidal portion 10 can be, for example, set as follows; H=2 μm (height), BW×BL=6 μm×10 μm (lower surface), TW×TL=4×8 μm (upper surface).

Figure 5:
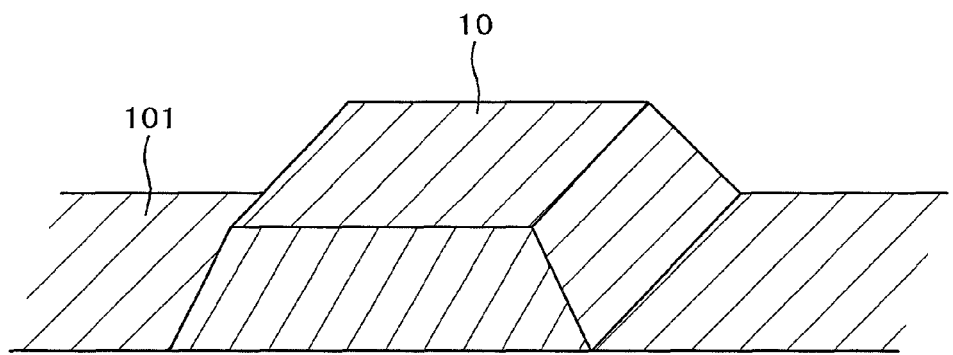
FIG. 5 is a perspective view of the trapezoidal portion with a gate line formed thereover.

FIG. 5 shows a state after the gate line 101 is formed. The width of the gate line 101 is identical with the width of the lower surface of the trapezoidal portion 10. Thus, the surface of the trapezoidal portion 10 is entirely covered by the gate line 101. Then, the gate insulating film 102 is formed by SiN sputtering so as to cover the whole area of the TFT substrate 100 (not illustrated).

Figure 6:
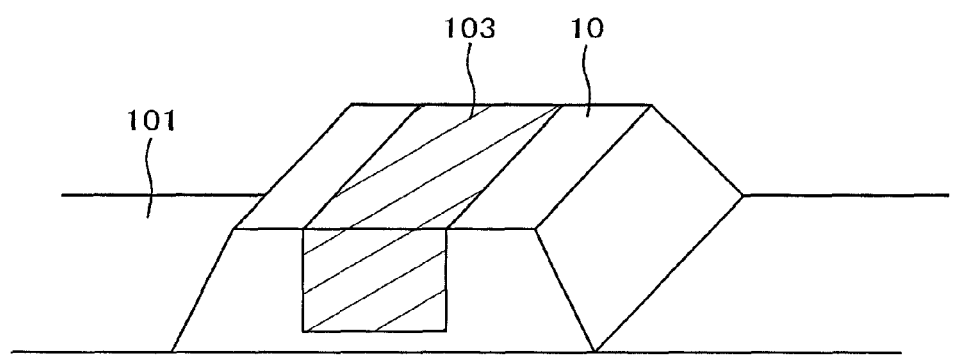
FIG. 6 is a perspective view of the trapezoidal portion with a semiconductor layer formed thereon.
Figure 7:
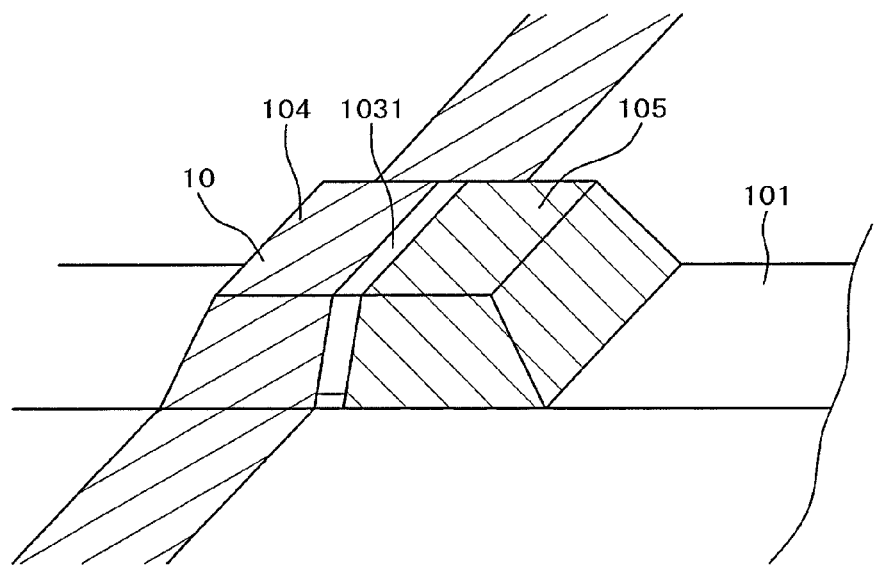
FIG. 7 is a perspective view of the trapezoidal portion with a drain electrode and a source electrode formed thereover.

In FIG. 6, a semiconductor layer 103, which is to be the channel portion 1031 of the TFT, is formed on the gate insulating film 102. The semiconductor layer 103 is formed on the upper surface and the two inclined surfaces of the trapezoidal portion 10 with a predetermined width. FIG. 7 shows a state after the drain line (electrode) 104 and the source electrode 105 is formed over the semiconductor layer 103, with a space between the electrodes for the channel portion 1031. The drain line 104 also serves as the drain electrode of the TFT. As shown in FIG. 7, since the channel portion 1031 of the TFT is formed over the upper surface and the inclined surfaces of the trapezoidal portion 10, the channel width can be enlarged and the ON current can be increased.

Figure 8:
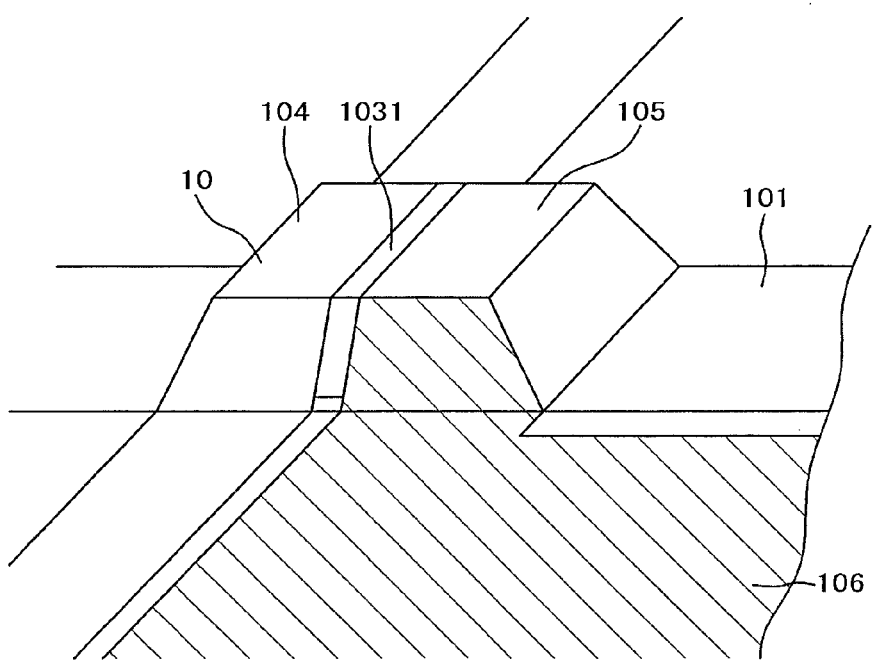
FIG. 8 is a perspective view showing a state where a pixel electrode is formed in a pixel region and in an inclined surface of the trapezoidal portion.

FIG. 8 shows a state after the pixel electrode 106 is formed. The pixel electrode 106 is formed so that part of the pixel electrode 106 overlap with part of the source electrode 105 above the inclined surface of the trapezoidal portion 10 (over which the source electrode 105 is formed). Thus, a through hole for connecting the drain electrode 104 of the TFT and the pixel electrode 106 is not needed in this embodiment.

Figure 9:
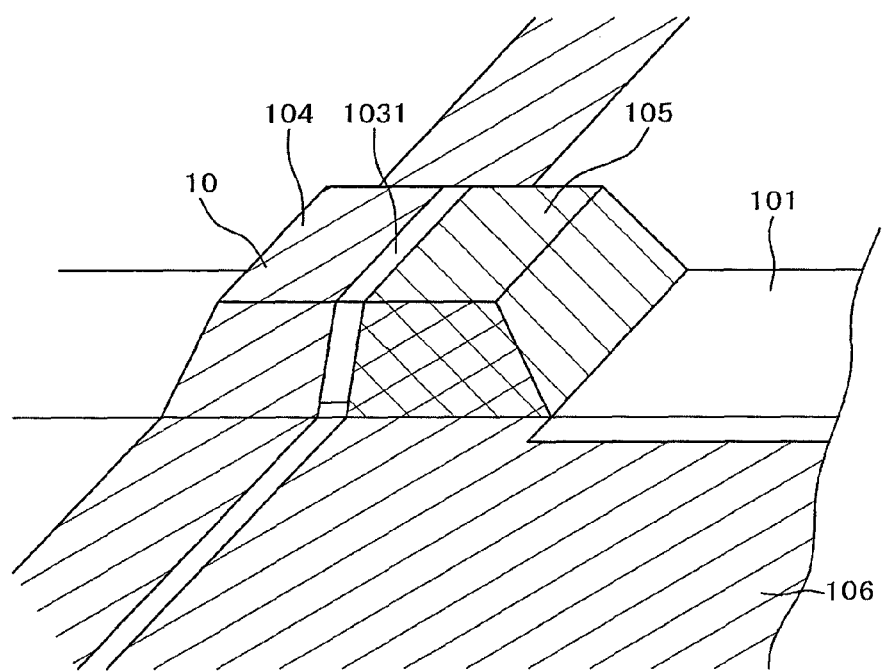
FIG. 9 is a perspective view showing a relationship of the drain electrode, the source electrode, the channel portion, and the pixel electrode in Embodiment 1.

FIG. 9 shows the drain line 104, the source electrode 105, and the pixel electrode 106 in hatched lines. The drawing shows that part of the pixel electrode 106 and part of the source electrode 105 overlap each other on the inclined surface of the trapezoidal portion 10. As shown in FIG. 9, the TFT and a through hole are not formed in the region surrounded by the gate line 101 and the drain line 104. Most of the region can therefore be used for forming the pixel electrode 106, and the transmittance of the liquid crystal display panel can be improved.

Figure 10:
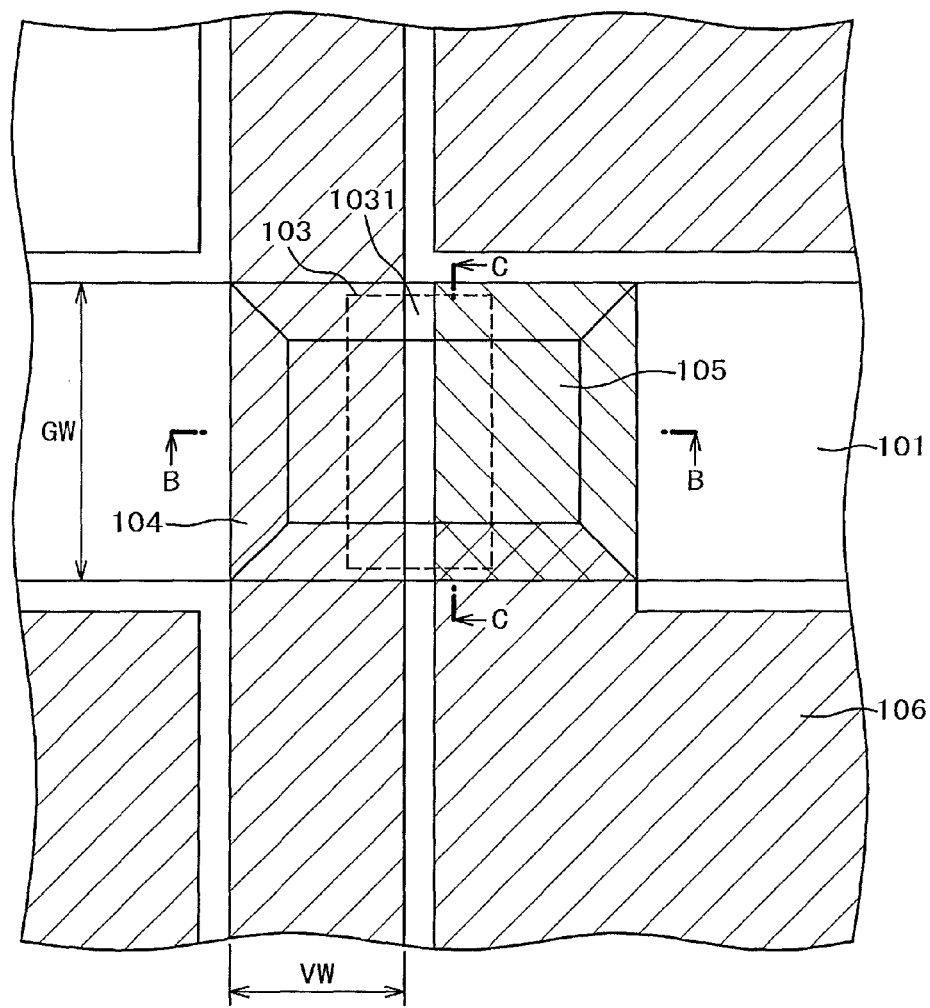
FIG. 10 is a plan view of a TFT portion formed over the trapezoidal portion.

FIG. 10 is a plan view of the TFT formed on the trapezoidal portion 10 and a vicinity of the intersection of the gate line 101 and the drain line 104. The drain line 104 and the source electrode 105 are formed on the left and right side of the trapezoidal portion 10, respectively. The channel portion 1031 of the TFT is defined by the space between the drain line 104 and the source electrode 105. In FIG. 10, part of the pixel electrode 106 extends to the inclined surface of the trapezoidal portion 10 to take electric connection with the source electrode 105.

Figure 11:
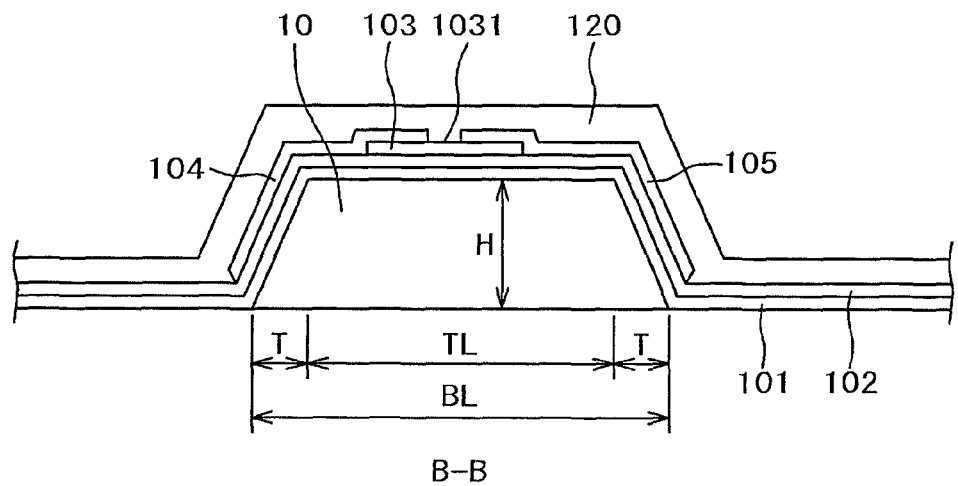
FIG. 11 is a cross sectional view taken along the line B-B in FIG. 10.

FIG. 11 is a cross sectional view taken along the line B-B in FIG. 10. In FIG. 11, the gate line 101 is formed covering the surface of the trapezoidal portion 10, and the gate insulating film 102 is formed covering the gate line 101. The semiconductor layer 103 is formed above the upper surface of the trapezoidal portion 10 (on the gate insulating film 102). The drain line 104 and the source electrode 105 are respectively formed on the left and right side of the channel portion 1031 of the semiconductor layer 103. The channel portion 1031 is defined by the space between the two. Then, an interlayer insulating film 120 of SiN is formed on the whole area.

Figure 12:
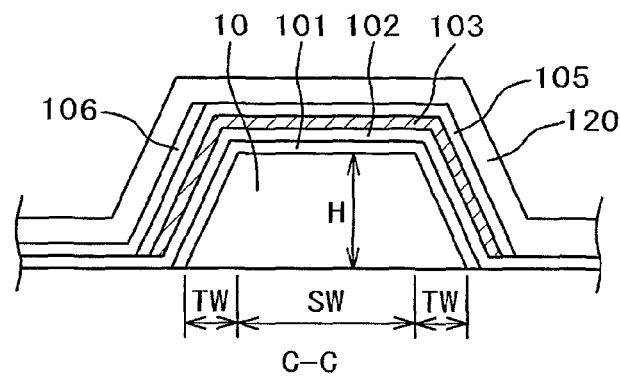
FIG. 12 is a cross sectional view taken along the line C-C in FIG. 10.

FIG. 12 is a cross sectional view taken along the line C-C in FIG. 10. In FIG. 12, the gate line 101 is formed covering the surface of the trapezoidal portion 10, and the gate insulating film 102 is formed covering the gate line 101. The semiconductor layer 103 is formed on the gate insulating film 102 covering the upper surface and the inclined surfaces of the trapezoidal portion 10. Thus, since the semiconductor layer 103 is formed over the upper surface and the inclined surfaces of the trapezoidal portion 10, the channel portion 1031 of the TFT can be formed with a large width.

In FIG. 12, the source electrode 105 is formed covering the semiconductor layer 103. The source electrode 105 and the pixel electrode 106 overlap on one of the inclined surfaces of the trapezoidal portion 10 to take electric conduction with each other. Then, an interlayer insulating film 120 is formed so as to cover the whole area. In FIG. 2, FIG. 9, FIG. 12, etc., the pixel electrode 106 and the source electrode 105 are in direct contact with each other on the inclined surface of the trapezoidal portion 10. In addition, they may also take contact on the upper surface of the trapezoidal portion 10.

As described above, according to this embodiment, the TFT can be formed over the trapezoidal portion 10 on which the gate line 101 is formed and a through hole for connecting the TFT and the pixel electrode 106 is not needed. Therefore, the transmittance of the liquid crystal display panel can be increased without lowering the performance of the TFT compared with the conventional structure.

Embodiment 2

Figure 13:
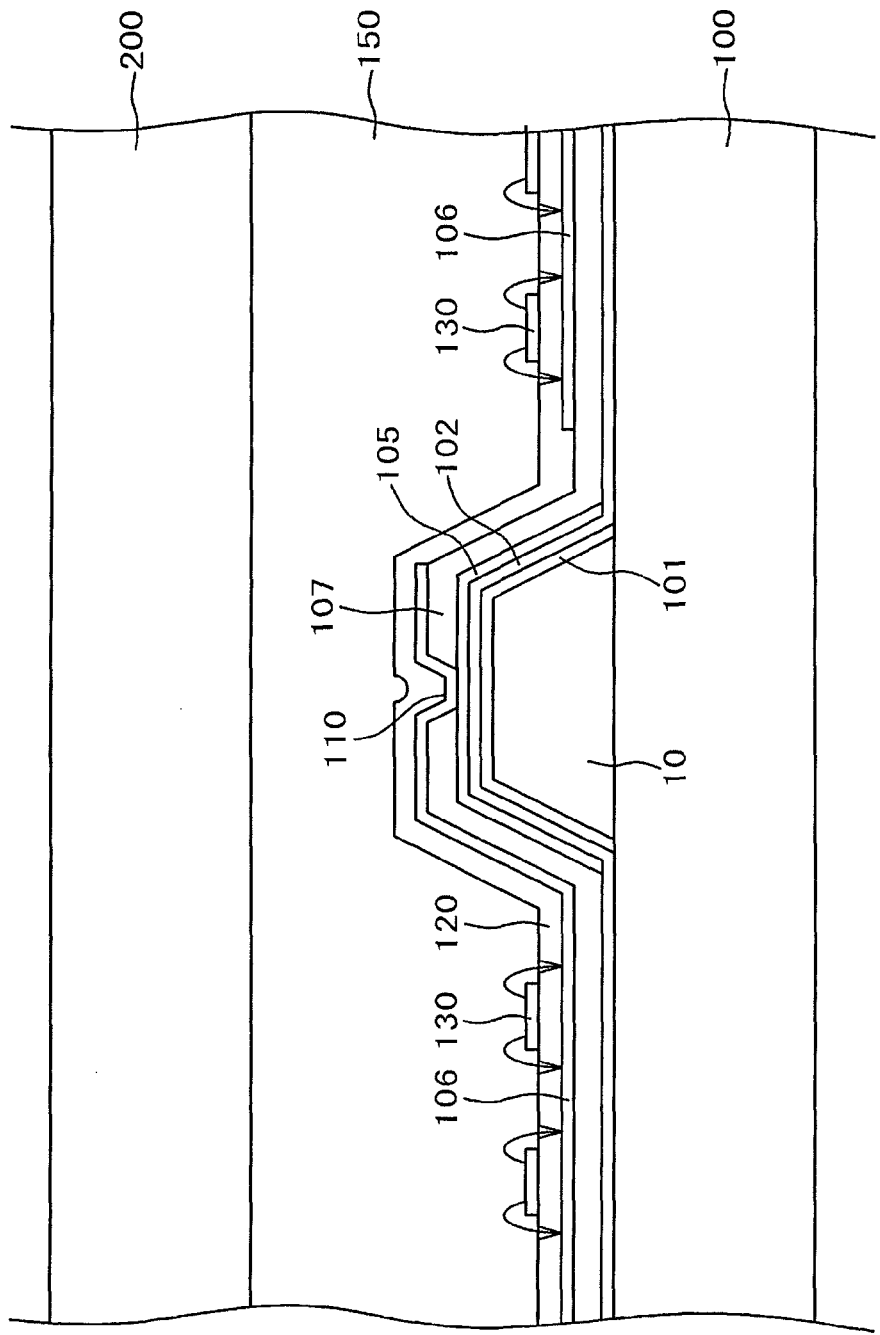
FIG. 13 is a cross sectional view of a liquid crystal display panel in Embodiment 2.

FIG. 13 is a drawing of the trapezoidal portion 10 of Embodiment 2, corresponding to a cross section taken along the line A-A in FIG. 1. In the drawing, the semiconductor layer 103 is not formed (not shown), and a through hole 110 that does not exist in FIG. 1 (in Embodiment 1) is shown. In Embodiment 1, electric conduction is taken by directly overlapping the pixel electrode 106 and the source electrode 105 of the TFT on the inclined surface of the trapezoidal portion 10. However, considering restrictions on a material for the source electrode 105, an etching solution in photolithography, and a material for liquid developer, etc., it may be difficult to adopt the configuration of Embodiment 1 in some cases. In such cases, the inorganic passivation film 107 is formed on the source electrode 105 and the pixel electrode 106 is formed thereon in a solid plane. The interlayer insulating film 120 is formed over the pixel electrode 106 and a comb-shaped counter electrode is formed on the interlayer insulating film 120.

In FIG. 13, the source electrode 105 and the pixel electrode 106 are electrically conducted by way of the through hole 110. Other operations in FIG. 13 are identical with those explained in Embodiment 1 referring to FIG. 2.

Figure 14:
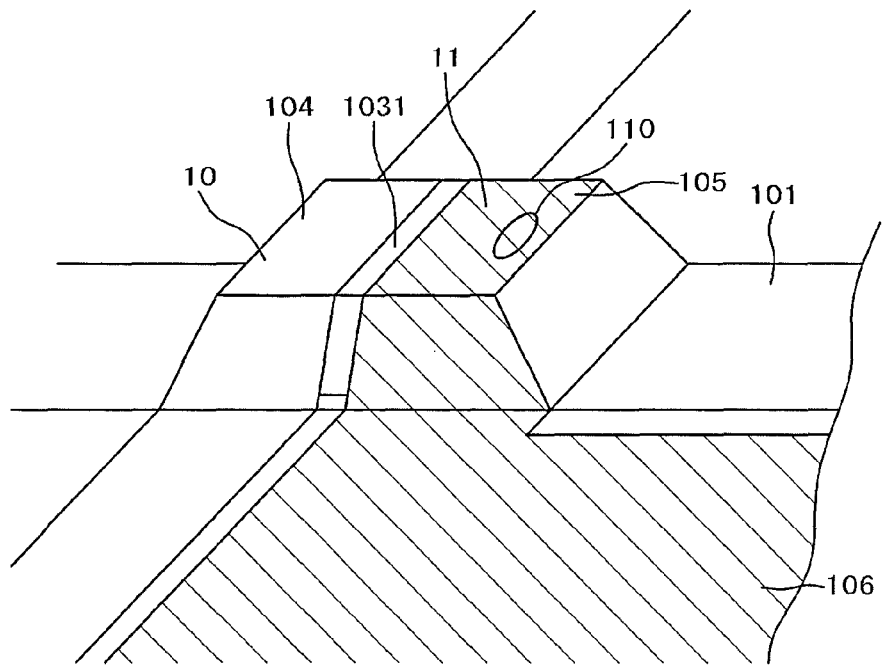
FIG. 14 is a perspective view showing the region where a pixel electrode is formed and a through hole formed in an inorganic passivation film in Embodiment 2.

FIG. 14 shows a part of processes of Embodiment 2. The steps of forming the gate line 101, the gate insulating film 102, the semiconductor layer 103, the drain line 104, and the source electrode 105 over the trapezoidal portion 10 are identical with that of Embodiment 1. In this embodiment, an inorganic passivation film 107 of SiN is formed subsequently. A through hole 110 is formed in the inorganic passivation film 107 above the upper surface of the trapezoidal portion 10.

As shown in FIG. 14, a pixel electrode 106 is formed so as to extend to the upper surface of the trapezoidal portion 10. Thus, the pixel electrode 106 and the source electrode 105 can be conducted electrically by way of the through hole 110 formed in the inorganic passivation film 107 above the upper surface of the trapezoidal portion 10.

Figure 15:
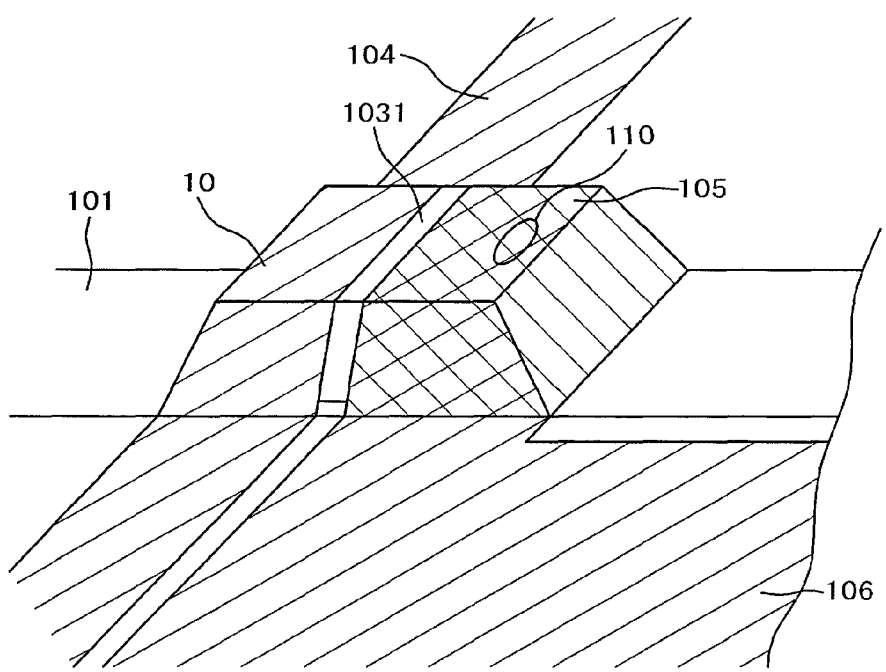
FIG. 15 is a perspective view showing a relationship of the drain electrode, the source electrode, the channel portion, the pixel electrode and the through hole in Embodiment 2.

FIG. 15 shows the drain line 104, the source electrode 105, and the pixel electrode 106 in hatched lines. Although the inorganic passivation film 107 is formed between the pixel electrode 106 and the source electrode 105, the pixel electrode 106 can be electrically conducted with the source electrode 105 above the upper surface of the trapezoidal portion 10 by way of the through hole 110.

Figure 16:
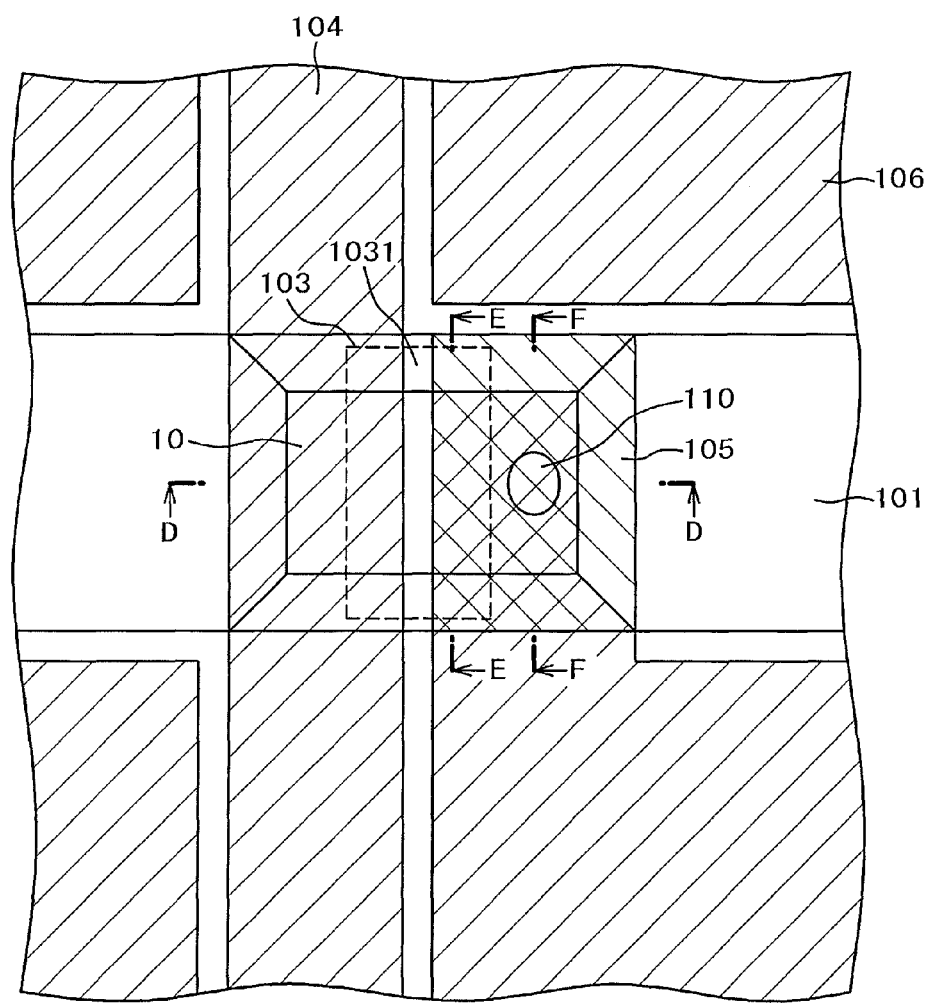
FIG. 16 is a plan view of a TFT portion formed in the trapezoidal portion of Embodiment 2.

FIG. 16 is a plan view of the TFT formed over the trapezoidal portion 10 and a vicinity of the intersection of the gate line 101 and the drain line 104. The drain line 104 and the source electrode 105 are respectively formed on the left and right side of the trapezoidal portion 10. The channel portion 1031 of the TFT is defined by the space between the drain line 104 and the source electrode 105. These configurations are same as that of Embodiment 1. In FIG. 16, the pixel electrode 106 is formed so that part of the electrode 106 extends to the inclined surface and the upper surface of the trapezoidal portion 10. The pixel electrode 106 is connected with the source electrode 105 by way of the through hole 110 formed in the inorganic passivation film (not illustrated).

Figure 17:
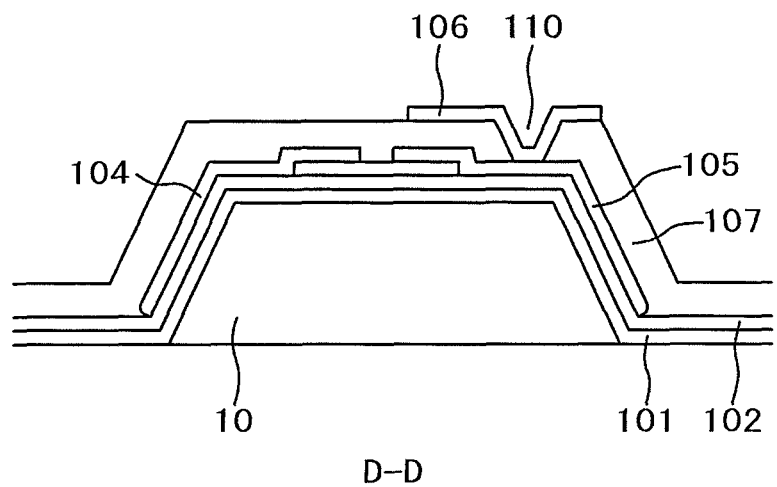
FIG. 17 is a cross sectional view taken along the line D-D in FIG. 16.

FIG. 17 is a cross sectional view taken along the line D-D in FIG. 16. In FIG. 17, the gate line 101 is formed covering the surface of the trapezoidal portion 10, and the gate insulating film 102 is formed covering the gate line 101. The semiconductor layer 103 is formed above the upper surface of the trapezoidal portion 10 (over the gate insulating film 102), and the drain line 104 and the source electrode 105 are respectively formed on the left and right of the trapezoidal portion 10. The channel portion 1031 of the semiconductor layer 103 is defined by the space between the drain line 104 and source electrode 105. Then, the inorganic passivation film 107 of SiN is formed to cover the whole area. The through hole 110 is formed in the inorganic passivation film 10 above the upper surface of the trapezoidal portion 10, and the pixel electrode 106 and the source electrode 105 are electrically connected thereby.

Figure 18:
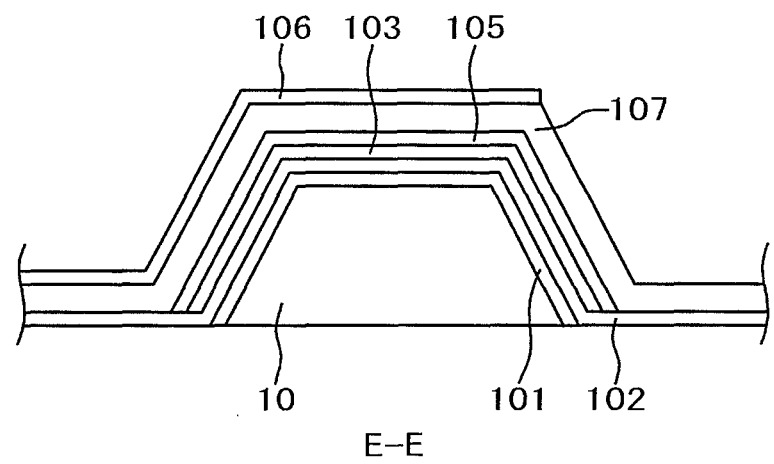
FIG. 18 is a cross sectional view taken along the line E-E in FIG. 16.

FIG. 18 is a cross sectional view taken along the line E-E in FIG. 16. In FIG. 18, the gate line 101 is formed covering the surface of the trapezoidal portion 10, and the gate insulating film 102 is formed covering the gate line 101. The semiconductor layer 103 is formed on the gate insulating film 102, over the upper surface and the inclined surfaces of the trapezoidal portion 10. Thus, since the semiconductor layer 103 is formed covering the upper surface and the inclined surfaces of the trapezoidal portion 10, the channel portion 1031 of the TFT can be formed with a large width.

In FIG. 18, the source electrode 105 is formed covering the semiconductor layer 103. The inorganic passivation film 107 is formed covering the source electrode 105. The pixel electrode 106 is formed on the inorganic passivation film 107, over the inclined surface and the upper surface of the trapezoidal portion 10. The pixel electrode 106 is in electric conduction with the source electrode 105 in other part (not shown in FIG. 18).

Figure 19:
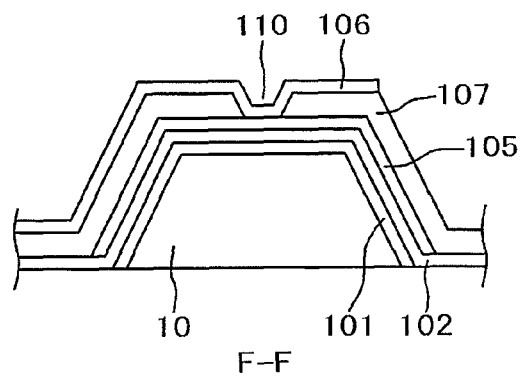
FIG. 19 is a cross sectional view taken along the line F-F in FIG. 16.

FIG. 19 is a cross sectional view taken along the line F-F in FIG. 16. In the cross section shown in FIG. 19, the semiconductor layer 103 is not formed and the source electrode 105 is formed on the gate insulating film 102. The inorganic passivation film 107 is formed covering the source electrode 105, and a through hole 110 is formed in the inorganic passivation film 107 above the upper surface of the trapezoidal portion 10. Part of the pixel electrode 106 extends to the upper surface of the trapezoidal portion 10, and is in electric conduction with the source electrode 105 via the through hole 110.

The cross sectional structure of the channel portion 1031 of the TFT is identical with that of Embodiment 1 explained referring to FIG. 3. Similar to Embodiment 1, the TFT is formed over the trapezoidal portion 10 on which the gate line 101 is formed, and is not needed to be formed in the pixel area in this embodiment. The transmittance of the liquid crystal display panel can therefore be improved. In addition, since the through hole 110 for electrically connecting the pixel electrode 106 and the source electrode 105 is formed above the upper surface of the trapezoidal portion 10 and not formed in the pixel area, the through hole 110 does not lower the transmittance of the liquid crystal display panel.

Embodiment 3

Figure 20:
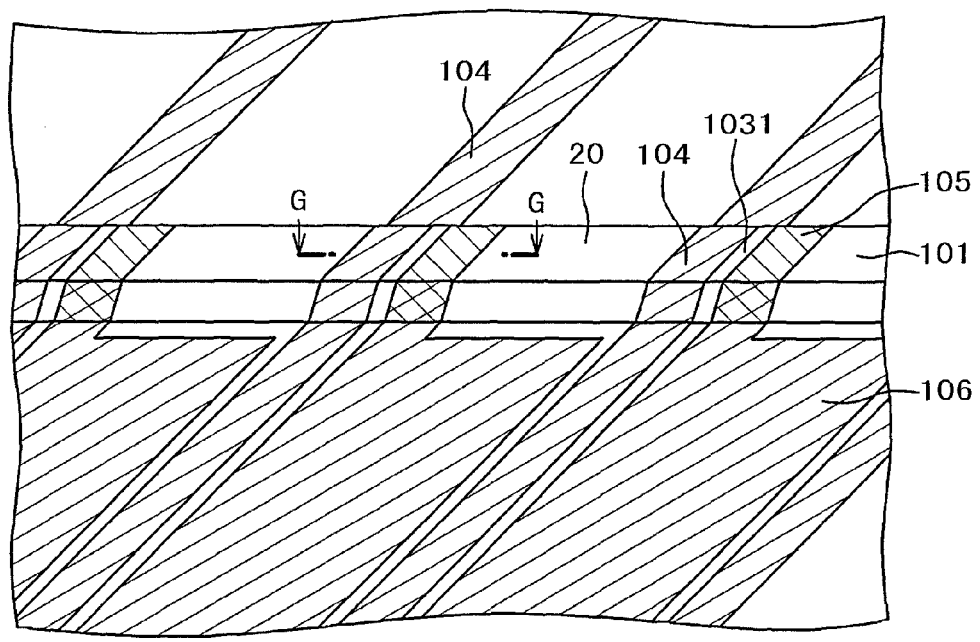
FIG. 20 is a perspective view of a TFT substrate in Embodiment 3.

FIG. 20 is a perspective view of the TFT substrate 100 of a third embodiment of the invention. In Embodiment 1, the trapezoidal portions 10 are formed below the gate line 101. Meanwhile, in this embodiment, a continuous bank 20 is formed below the gate line 101. Since the continuous bank 20 is formed instead of the trapezoidal protrusion, the gate line 101 does not need to be formed on numerous bumps, and the gate line 101 according to this embodiment is less likely to be disconnected compared with Embodiment 1.

In FIG. 20, the drain line 104 extends in the longitudinal direction and overrides the bank 20. The gate line 101 extends in the lateral direction and covers the continuous bank 20. The pixel electrode 106 is formed in the area surrounded by the drain line 104 and the gate line 101. The TFT is formed at the upper surface and the inclined surfaces of the bank 20. The drain line 104 also serves as the drain electrode 104 over the bank 20, and a source electrode 105 is formed on the right side of a channel portion 1031 which is defined by the space between them. Since the channel portion 1031 of the TFT is formed at the upper surface and the inclined surfaces of the bank 20, the width of the channel can be enlarged, similarly to Embodiment 1.

Figure 21:
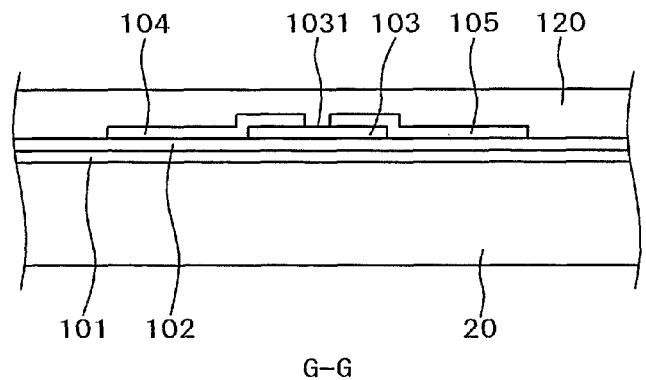
FIG. 21 is a cross sectional view taken along the line G-G in FIG. 20.

In FIG. 20, the pixel electrode 106 extends to the inclined surface of the bank 20 and is electrically connected with the source electrode 105 in this portion. Thus, the through hole 110 for taking electric conduction between the pixel electrode 106 and the source electrode 105 is not necessary in this embodiment as well. FIG. 21 is a cross sectional view taken along the line G-G in FIG. 20. In FIG. 21, the gate line 101 is formed over the bank 20 and the gate insulating film 102 is formed thereover. The semiconductor layer 103 is formed on the gate insulating film 102, and the drain line (electrode) 104 and the source electrode 105 is respectively formed on the left and right side of the semiconductor layer 103. The channel portion 1031 is defined by the space between the drain electrode 104 and the source electrode 105. The interlayer insulating film 120 is formed covering the TFT.

Similar to the aforementioned embodiments, the TFT and the thorough hole 110 do not need to be formed in the pixel region in this embodiment. The transmittance of the liquid crystal display panel can therefore be improved without lowering the performance of the TFT.

Embodiment 4

Figure 22:
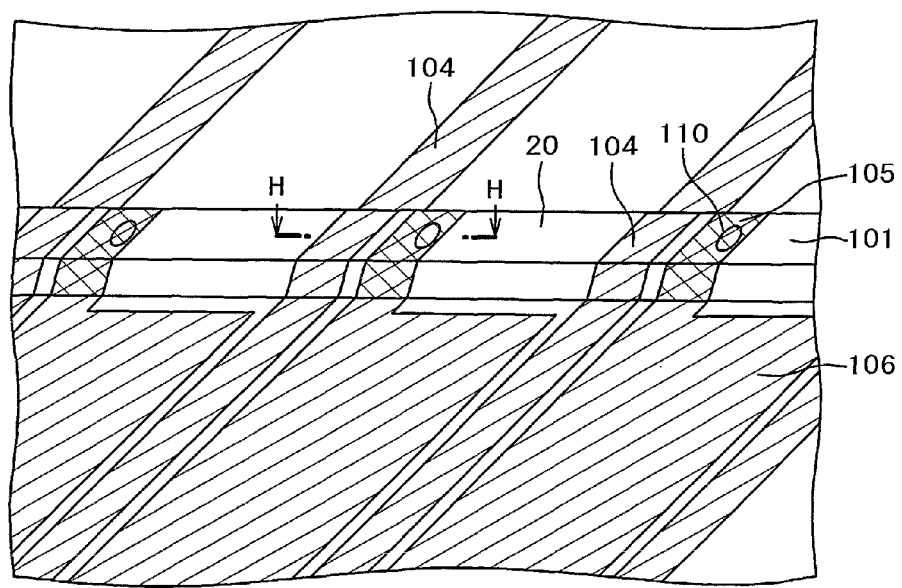
FIG. 22 is a perspective view of a TFT substrate in Embodiment 4.

FIG. 22 is a perspective view of a TFT substrate 100 according to a fourth embodiment of the invention. This embodiment is different from Embodiment 2 in that the continuous bank 20 is formed below the gate line 101 instead of the trapezoidal portion 10. Thus, the gate line 101 does not need to be formed on numerous bumps. This makes the gate line 101 less likely to be disconnected compared with Embodiment 2.

In the configuration shown in FIG. 22, the pixel electrode 106 and the source electrode 105 are in electric conduction by way of the through hole 110 formed in the interlayer insulating film 120 above the upper surface of the bank 20. Except this point, the rest of the configuration shown in FIG. 22 is substantially similar to the configuration shown in FIG. 20 of Embodiment 3. Detailed description of FIG. 22 is therefore omitted. Similar to the aforementioned embodiments, since the channel portion 1031 of the TFT is formed on the upper surface and the inclined surface 20 of the bank 20, the width of the channel can be enlarged.

In FIG. 22, the pixel electrode 106 extends to the upper surface of the bank 20 and is electrically connected with the pixel electrode 105 by way of the through hole 110 formed in the inorganic passivation film 107. Thus, the through hole 110 is not formed in the pixel region.

Figure 23:
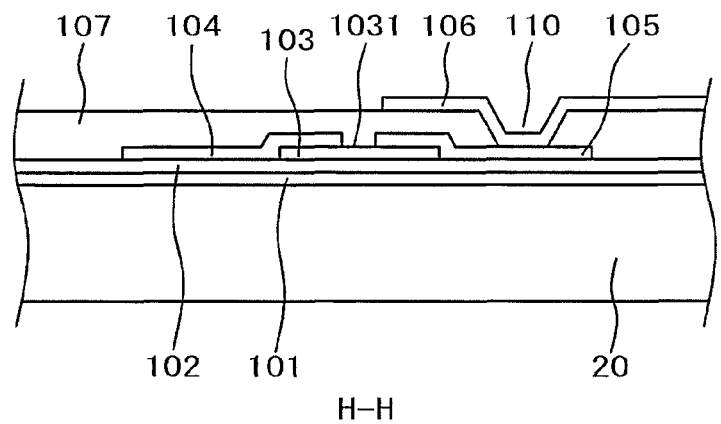
FIG. 23 is a cross sectional view taken along the line H-H in FIG. 22.

FIG. 23 is a cross sectional view taken along the line H-H in FIG. 22. In FIG. 23, the steps up to the formation of the drain line 104 and the electrode 105 are identical with the steps described referring to FIG. 21 in Embodiment 3. In FIG. 23, the inorganic passivation film 107 is formed over the drain line 104 and the source electrode 105. Both of the inorganic passivation film 107 and the interlayer insulation 120 in FIG. 21, which corresponds to the inorganic passivation film 107 in FIG. 23, are formed by SiN sputtering.

The through hole 110 is formed in the inorganic passivation film 107 above the upper surface of the bank 20. The source electrode 105 and the pixel electrode 106 extending to the upper surface of the bank 20 is electrically connected by way of the through hole 110. Then, the interlayer insulating film 120 (not shown) is formed covering the pixel electrode 106.

Although the through hole 110 is formed in this embodiment, the through hole 110 is formed above the upper surface of the bank 20 and does not exist in the pixel region. The transmittance of the pixel region is therefore not lowered. In addition, since the TFT can be formed over the bank 20 without lowering the ON current performance, the transmittance of the liquid crystal display panel can be improved.

Embodiment 5

The aforementioned embodiments have been explained with reference to the IPS liquid crystal display device. However, in the TN or VA liquid crystal display device, a problem similar to that of the IPS liquid crystal display device exists. That is, when the area of the pixel is decreased, the relative area of the TFT or the through hole 110 is increased and the transmittance is lowered. Accordingly, the present invention described previously is also applicable to the TN or VA system.

Figure 24:
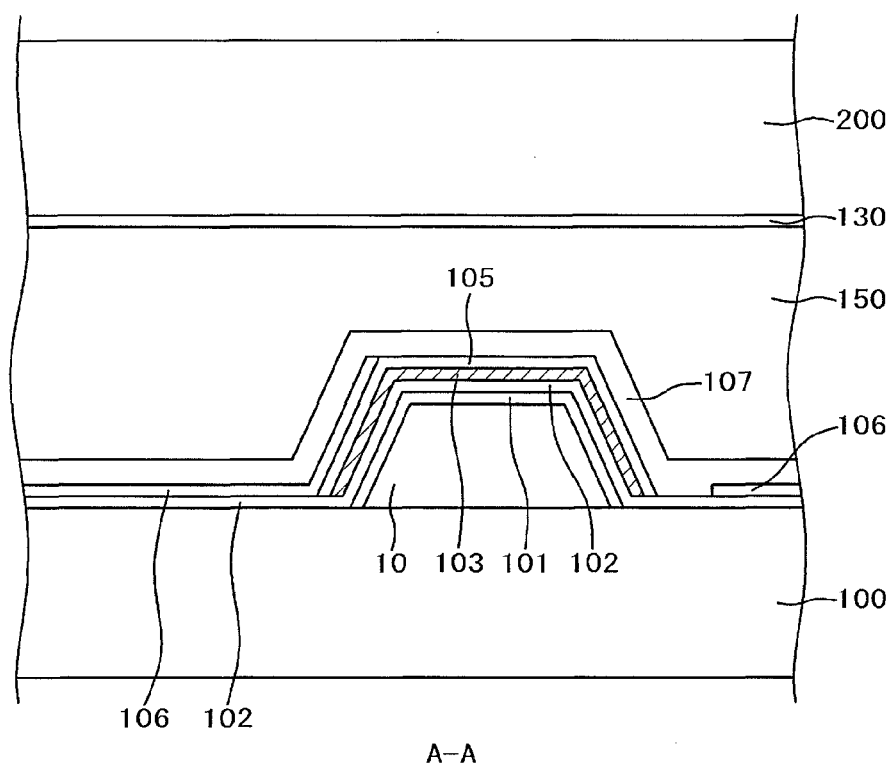
FIG. 24 is a cross sectional view of a liquid crystal display panel of Embodiment 5.

FIG. 1 is a perspective view of the TFT substrate 100. The configuration of FIG. 1 is applicable to the TFT substrate 100 of the TN or VA system as well. FIG. 24 is a cross sectional view of part of a TN liquid crystal display device, the part corresponding to the cross sectional view taken along the line A-A in FIG. 1. In FIG. 24, the trapezoidal portion 10 is formed on the TFT substrate 100, the gate line 101 is formed covering the trapezoidal portion 10, the gate insulating film 102 is formed over the gate line 101, and the semiconductor layer 103 is formed thereon. The source electrode 105 is formed covering the semiconductor layer 103. The pixel electrode 106 extending from the pixel region and the source electrode 105 are in direct contact and electrically connected with each other above the inclined surface of the trapezoidal portion 10.

The inorganic passivation film 107 is formed covering the source electrode 105. The inorganic passivation film 107 is formed so as to protect the channel portion 1031 formed in other part of the TFT. A counter electrode 130 is formed to the counter substrate 200, and the liquid crystal layer 150 is put between the counter substrate 200 and the TFT substrate 100. As described, the same configuration as explained in Embodiment 1 can be applied to the TFT substrate 100 of the TN liquid crystal display device, and the transmittance of the pixel area can be improved. While the above description was made referring to Embodiment 1, the bank 20, explained in Embodiment 3, may be applied instead of the trapezoidal portion 10 in the TN liquid crystal display device as well.

Embodiment 6

Figure 25:
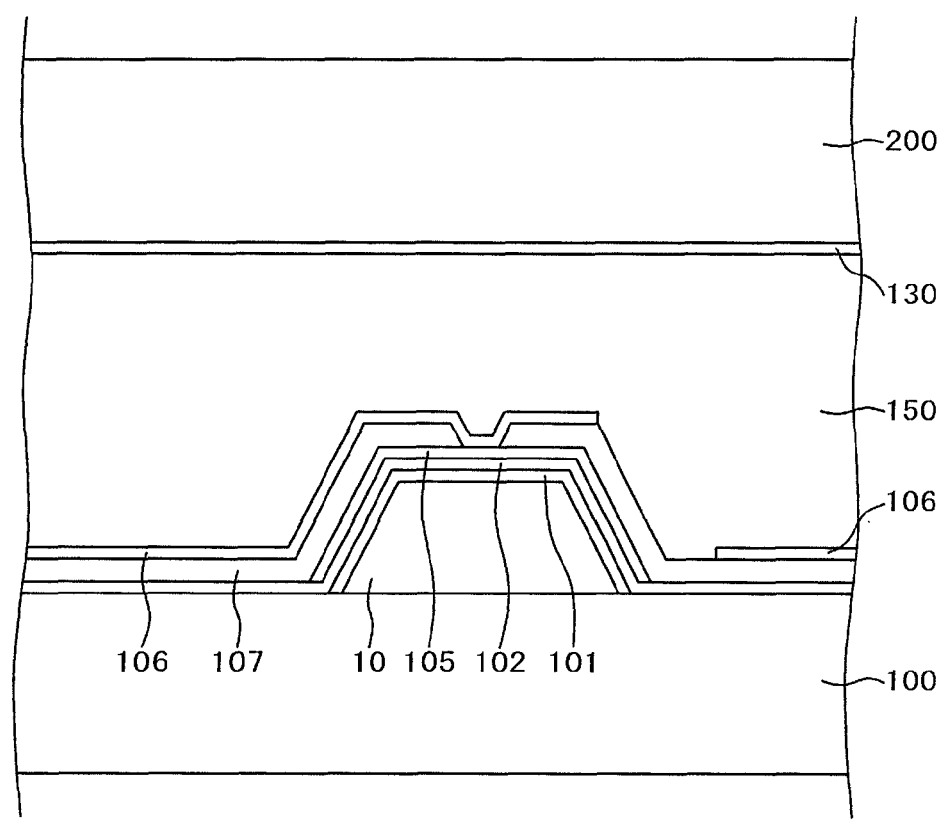
FIG. 25 is a cross sectional view of a liquid crystal display panel of Embodiment 6.

FIG. 25 is a drawing of the trapezoidal portion 10 corresponding to the cross sectional view taken along the line A-A in FIG. 1. In the drawing, the semiconductor layer 103 is not formed (not shown) and the through hole 110 which does not exist in FIG. 1 is formed.

That is, this drawing is a cross sectional view corresponding to FIG. 13 in Embodiment 2. In FIG. 25, the gate line 101 is formed over the trapezoidal portion 10, the gate insulating film 102 is formed over the gate line 101, and the source electrode 105 is formed thereon. Since the semiconductor layer 103 exist in other part of the trapezoidal portion 10 in FIG. 25, the semiconductor layer 103 is not illustrated.

The inorganic passivation film 107 is formed covering the source electrode 105, and the pixel electrode 106 is connected with the source electrode 105 by way of the through hole 110 formed in the inorganic passivation film 107. The counter electrode 130 is formed to the counter substrate 200, and the liquid crystal layer 150 is put between the counter substrate 200 and the TFT substrate 100.

As described, the same configuration as explained in Embodiment 2 can be applied to the TFT substrate 100 of the TN liquid crystal display device, and the transmittance of the pixel portion can be improved. While the above description was made referring to Embodiment 2, the bank 20, explained in Embodiment 4, may be applied instead of the trapezoidal portion 10 in the TN liquid crystal display device as well.

Embodiment 5 and Embodiment 6 have been described by taking the TN system for example. The present invention may also be applied to the VA liquid crystal display device in the same manner as described for the TN system.

What is claimed is:
1. A liquid crystal display device comprising:
a TFT substrate;
gate lines formed over the TFT substrate;
drain lines formed over the TFT substrate;
pixel electrodes each formed in a region surrounded by the gate lines and drain lines;
protrusions formed below the gate lines, each of the protrusions having an upper surface and at least one inclined side surface;
a gate insulating film formed over the gate lines;
a semiconductor layer formed on the gate insulating film;
drain electrodes formed by the drain lines over the semiconductor layer;
source electrodes formed over the semiconductor layer; and
channel portions defined by the space between the drain electrodes and the source electrodes, each of the channel portions being formed covering the upper surface and at least one of the at least one inclined side surface of one of the protrusion;
wherein the pixel electrode and the source electrode are in contact with each other on at least one of the at least one inclined side surface of the protrusion.

2. A liquid crystal display device according to claim 1, wherein an interlayer insulating film, and comb-shaped counter electrodes are formed on the insulating film.

3. A liquid crystal display device according to claim 1, further comprising a counter substrate opposed to the TFT substrate by way of a liquid crystal layer and a counter electrode formed to the counter substrate.

4. A liquid crystal display device comprising:
a TFT substrate;
gate lines formed over the TFT substrate;
drain lines formed over the TFT substrate;
pixel electrodes each formed in a region surrounded by the gate lines and drain lines;
protrusions formed below the gate line, each of the protrusions having an upper surface and at least one inclined side surface;
a gate insulating film formed over the gate lines;
a semiconductor layer formed on the gate insulating film;
drain electrodes formed by the drain lines over the semiconductor layer;
source electrodes formed over the semiconductor layer;
channel portions defined by the space between the drain electrodes and the source electrodes, each of the channel portions being formed covering the upper surface and at least one of the at least one inclined side surfaces of the protrusion; and
an inorganic passivation film formed over the source electrode;
wherein one of the pixel electrodes is formed on at least one of the at least one inclined side surface and the upper surface of the protrusion, and the pixel electrode is connected with the source electrode by way of a through hole formed in the organic passivation film above the upper surface of the protrusion.

5. A liquid crystal display device according to claim 4, wherein an interlayer insulating film, and comb-shaped counter electrodes are formed on the interlayer insulating film.

6. A liquid crystal display device according to claim 4, further comprising a counter substrate opposed to the TFT substrate by way of a liquid crystal layer and a counter electrode formed to the counter substrate.

7. A liquid crystal display device comprising:
a TFT substrate;
gate lines formed over the TFT substrate;
drain lines formed over the TFT substrate;
pixel electrodes each formed in a region surrounded by the gate lines and drain lines;

banks formed continuously below the gate lines, each of the banks having an upper surface and at least one inclined side surface;

a gate insulating film formed over the gate lines;

a semiconductor layer formed on the gate insulating film;

drain electrodes formed over the semiconductor layer;

source electrodes formed over the semiconductor layer; and channel portions defined by the space between the drain electrodes and the source electrodes, each of the channel portions being formed covering the upper surface and at least one of the at least one inclined side surface of the bank;

wherein one of the pixel electrode and the source electrode are in contact with each other on at least one of the at least one inclined side surface of the bank.

8. A liquid crystal display device comprising:

a TFT substrate;

gate lines formed over the TFT substrate;

drain lines formed over the TFT substrate;

pixel electrodes each formed in a region surrounded by the gate lines and drain lines;

banks formed below the gate lines, each of the banks having an upper surface and at least one inclined side surface;

a gate insulating film formed over the gate lines;

a semiconductor layer formed on the gate insulating film;

drain electrodes formed by the drain lines over the semiconductor layer;

source electrodes formed over the semiconductor layer;

channel portions defined by the space between the drain electrodes and the source electrodes, each of the channel portions being formed covering the upper surface and at least one of the at least one inclined side surface of the bank; and an inorganic passivation film formed over the source electrode;

wherein one of the pixel electrodes is formed on at least one of the at least one inclined side surface and the upper surface of the bank, and the pixel electrode is connected with the source electrode by way of a through hole formed in the organic passivation film above the upper surface of the bank.

* * * * *